(12) United States Patent
Brien et al.

(10) Patent No.: US 8,841,221 B2
(45) Date of Patent: Sep. 23, 2014

(54) MOCVD REACTOR HAVING CYLINDRICAL GAS INLET ELEMENT

(75) Inventors: Daniel Brien, Aachen (DE); Oliver Schön, Herzogenrath (DE)

(73) Assignee: Aixtron SE, Herzogenrath (DE)

( * ) Notice: Subject to any disclaimer, the term of this patent is extended or adjusted under 35 U.S.C. 154(b) by 671 days.

(21) Appl. No.: 13/139,279

(22) PCT Filed: Dec. 18, 2009

(86) PCT No.: PCT/EP2009/009133
§ 371 (c)(1),
(2), (4) Date: Aug. 16, 2011

(87) PCT Pub. No.: WO2010/072380
PCT Pub. Date: Jul. 1, 2010

(65) Prior Publication Data
US 2011/0294283 A1    Dec. 1, 2011

(30) Foreign Application Priority Data
Dec. 23, 2008 (DE) .......... 10 2008 055 582

(51) Int. Cl.
| | | |
|---|---|---|
| *H01L 21/31* | (2006.01) | |
| *H01L 21/469* | (2006.01) | |
| *C23C 16/455* | (2006.01) | |
| *C30B 25/14* | (2006.01) | |
| *C30B 29/40* | (2006.01) | |

(52) U.S. Cl.
CPC .......... *C23C 16/45574* (2013.01); *C30B 25/14* (2013.01); *C30B 29/40* (2013.01); *C23C 16/4558* (2013.01); *C23C 16/45508* (2013.01)
USPC ............................. 438/765; 438/509; 118/728

(58) Field of Classification Search
CPC .......... H01J 37/32357; H01J 37/3244; H01L 21/02274; H01L 21/02271; H01L 21/67011
USPC .......... 438/509, 758, 765; 118/715, 725, 728
See application file for complete search history.

(56) References Cited

U.S. PATENT DOCUMENTS

| | | | | |
|---|---|---|---|---|
| 7,332,038 B2 * | 2/2008 | Jurgensen et al. | ............ | 118/715 |
| 7,625,448 B2 | 12/2009 | Dauelsberg et al. | | |
| 2003/0180460 A1 * | 9/2003 | Strauch et al. | ............ | 427/248.1 |
| 2008/0308040 A1 | 12/2008 | Dauelsberg | | |
| 2009/0013930 A1 * | 1/2009 | Reinhold et al. | ............ | 118/715 |

FOREIGN PATENT DOCUMENTS

| | | |
|---|---|---|
| DE | 100 64 944 A1 | 4/2002 |
| DE | 10 2004 009130 A1 | 9/2005 |
| JP | 10-32169 A | 2/1998 |

OTHER PUBLICATIONS

Aixtron AG; PCT/EP2009/009133 filed Dec. 18, 2009; International Search Report and Written Opinion; ISA/EP; mailed Mar. 24, 2010; 13pp.

\* cited by examiner

*Primary Examiner* — Jarrett Stark
*Assistant Examiner* — John M Parker
(74) *Attorney, Agent, or Firm* — Ascenda Law Group, PC

(57) ABSTRACT

The invention relates to a device for depositing semiconductor layers, comprising a process chamber (1) arranged substantially rotationally symmetrically about a center (11), a susceptor (2), a process chamber ceiling (3), a gas inlet element (4) having gas inlet chambers (8, 9, 10) that are arranged vertically on top of each other, and a heater (27) arranged below the susceptor (2), wherein the topmost (8) of the gas inlet chambers is directly adjacent to the process chamber ceiling (3) and is connected to a feed line (14) for feeding a hydride together with a carrier gas into the process chamber (1), wherein the lowest (10) of the gas inlet chambers is directly adjacent to the susceptor (2) and is connected to a feed line (16) for feeding a hydride together with a carrier gas into the process chamber (1), wherein at least one center gas inlet chamber (9) arranged between the lowest (10) and the topmost (8) gas inlet chamber is connected to a feed line (15) for feeding an organometallic compound into the process chamber (1). According to the invention, the gas inlet chambers (8, 9, 10) are closed off toward the process chamber (1) by annular walls (22, 23, 24), wherein the annular walls (22, 23, 24) comprise a plurality a gas outlet openings (25) arranged closely next to each other, have a uniform outside diameter, and an outer wall that is substantially without projections and directed toward the process chamber (1).

19 Claims, 5 Drawing Sheets

US 8,841,221 B2

MOCVD REACTOR HAVING CYLINDRICAL GAS INLET ELEMENT

CROSS REFERENCE TO RELATED APPLICATIONS

This is a NATIONAL STAGE under 35 USC 371 of and claims priority to International Application PCT/EP2009/009133, filed 18 Dec. 2009, incorporated herein by reference, which claims priority to DE 10 2008 055 582.7, filed 23 Dec. 2008.

FIELD OF THE INVENTION

The invention relates to a device for depositing layers, in particular semiconductor layers, comprising a process chamber arranged substantially rotationally symmetrically about a center, the process chamber having a bottom formed from a susceptor disposed in a horizontal plane, a process chamber ceiling disposed vertically above the susceptor, a gas inlet element extending between susceptor and process chamber ceiling and having gas inlet chambers which are disposed vertically one above the other, and a heater disposed below the susceptor for heating the susceptor, wherein, on the susceptor, a plurality of substrate holders arranged spaced apart from the gas inlet element are provided for accommodating substrates to be coated, wherein a topmost of the gas inlet chambers is directly adjacent to the process chamber ceiling and is connected to a feed line for introducing a hydride together with a carrier gas into the process chamber, wherein a lowermost of the gas inlet chambers is directly adjacent to the susceptor and is connected to a feed line for introducing a hydride together with a carrier gas into the process chamber, wherein at least one middle gas inlet chamber disposed between the lowermost and the topmost gas inlet chamber is connected to a feed line for introducing a organometallic compound into the process chamber.

Furthermore, the invention relates to the use of such a device for depositing a semiconductor layer on a substrate, wherein, through the gas outlet openings of the topmost gas inlet chamber and through the gas outlet openings of the lowermost gas inlet chamber, together with a carrier gas, a hydride, for example $NH_3$, $PH_3$ or $AsH_3$, and through the gas outlet openings of the middle gas inlet chamber, an organometallic compound, for example TMGa, TMIn or TMAl, are fed into the process chamber heated by the heater.

BACKGROUND

DE 10 2004 009 130 A1 describes a gas inlet system for a MOCVD reactor wherein the process gases are fed into the process chamber at different heights through three gas inlet zones arranged vertically one above the other. The process chamber extends annularly around the gas inlet element, which is disposed in the center of symmetry of the gas chamber. For depositing a III-V semiconductor layer on a substrate, in each case the V component in the form of a hydride is fed through the lowermost and through the topmost gas inlet zone. Through the middle gas inlet zone lying therebetween, the III component in the form of an organometallic compound is fed into the process chamber. The three gas inlet zones arranged one above the other form gas inlet chambers, which are open toward the process chamber. Only the middle gas inlet chamber is closed off by an annular body made of a porous material. Said annular body is intended to act as pressure barrier. The substrates are annularly grouped around the gas inlet element disposed in the center of the process chamber.

DE 10 2005 056 320 A1 describes a CVD reactor having a gas inlet element which forms two gas inlet zones arranged vertically one above the other. A cooled lower end of the gas inlet element lies in a bottom cut-out of the susceptor, which is heated from below.

DE 101 53 463 A1 also describes a MOCVD reactor for depositing II-V semiconductor layers, the reactor having a gas inlet element disposed in the center of a process chamber. Here, the V component is fed into the process chamber through a front end opening on the lower side of the gas inlet element. The III component flows from a gas inlet chamber, disposed thereabove and enclosed by a porous ring, into the process chamber.

SUMMARY OF THE INVENTION

A similar device is described in DE 100 64 941 A1. There, the gas inlet chamber, which is enclosed by a porous ring, has a rear side which faces toward the center and has the shape of a hyperboloid of revolution so as to give the gas flow exiting through the porous wall a specific flow profile.

With the measure described in the aforementioned DE 10 2004 009 130 A1, a first improvement of the efficiency of a MOCVD reactor is achieved. It is proposed therein to feed the V component into the process chamber not only immediately above the susceptor but also directly below the process chamber ceiling. While the susceptor is usually actively heated from below by resistance heating or IR heating so as to achieve the required process temperature on the surface of the susceptor, the process chamber ceiling is normally not actively heated but mostly actively cooled. Consequently, a vertical temperature gradient develops within the process chamber through which the gas flows.

The typically used precursors, thus $PH_3$, $AsH_3$ and $NH_3$ or TMGa, TMIn or TMAl, decompose at different temperatures in the gas phase. Here, the decomposition temperature of the organometallic components is significantly lower than the decomposition temperature of the hydrides. While the former decompose already at approximately 170° C., the decomposition temperature of $NH_3$ lies far above 1500° C. However, the process temperatures on the surface of the susceptor on which the substrates rest are only in the range from 500° C. to 1200° C. Thus, the crystal growth is substantially determined by the available quantity of the III component. At the total pressures of approximately 200 mbar, which are typical for the prior art, the growth rate is in the range between 2 to 3 μm per hour.

With the above-described device, vertical layer structures for the production of bright light-emitting diodes are deposited. Essential for the efficiency, thus the energy yield of light-emitting diodes, is the crystalline quality of the surface on which the p-n layer structures of the light-emitting diodes are deposited. An essential material of said layer structures is GaN. Since for economic reasons, a substrate material is used which has a different crystal lattice constant than GaN, namely normally $Al_2O_3$, the substrate has to be deposited on a buffer layer so as to be able to deposit the actual active layers on the latter in a lattice-adapted manner. Depositing such a buffer layer requires in first instance depositing a GaN nucleation layer directly onto the sapphire substrate. This takes place at relatively low growth temperatures (between 500° C. and 600° C.). Onto said relatively thin nucleation layer, a typically 5 μm thick buffer layer is then deposited in such a manner that the surface of the same on which the active layers are to be deposited has optimal crystalline properties. The quality of the surface of the buffer layer depends, on the one hand, on the V/III ratio of the precursors in the gas phase and on the total pressure in the gas phase. Both values have to be as high as possible. With increasing total pressure, the decomposition rate of the hydride in the gas phase increases as well. Thus, the aim is a total pressure in the region of the atmospheric pressure and a concentration of hydride, thus $NH_3$, in the gas phase, which is as high as possible.

At the same time, it is desirable for efficiency reasons to increase the growth rate. The process time for depositing the buffer layer in MOCVD reactors as it is described by the aforementioned prior art is typically approximately two hours. Increasing the TMGa flow for enhancing the growth rate is possible; however, this does not lead to the desired success. In fact, it was observed that only in case of relatively low TMGa concentrations in the gas phase, does the growth rate increase linearly with the TMGa concentration. Above a certain TMGa concentration, saturation effects occur. These saturation effects result in a dramatically decreasing material efficiency of the process. Despite adding more precursors, the material deposition increases only insignificantly.

The increase of the TMGa concentration in the gas phase did not only result in a reduction in the material efficiency but also in an increase of homogenous gas phase reactions between the individual precursors in the gas phase.

Furthermore, it was observed that an increase of the total pressure within the process chamber beyond the typically used 200 mbar, for the purpose of achieving a higher decomposition rate of the hydride, also results in an increase of homogenous gas phase reactions between the precursors. The homogenous gas phase reactions which are relevant here are to be understood as nucleations within the gas phase in the manner of an adduct formation between the organometallic component and the hydride. The number of nucleations depends, on the one hand, on the process temperature and, on the other, on the residence time of the precursors in a critical temperature range from 500° C. to 700° C. Moreover, the number of nucleations depends on the nucleation conditions within the process chamber and in particular within the gas phase. It was observed that the nucleation depends disproportionally on the gradient of the velocity and the temperature in the gas phase.

In case of gas inlet system as described by the aforementioned prior art, high temperature gradients and also, due to stall edges, high velocity gradients can develop. Unfortunately, they are in a range in which the gas temperature is in the critical temperature range between 500° C. and 700° C. In fact, so as to prevent pre-reactions within the gas inlet element, the precursors have to be fed as cool as possible into the inlet region of the process chamber.

The invention is based on the knowledge gained through experiments and theoretical considerations that with the previous reactor geometry and in particular with the previous configuration of the gas inlet element, no increase of the growth rate by further increasing the TMGa concentration in the gas phase and also no improvement of the crystal quality by increasing the total pressure is possible. It is an object of the invention to specify measures by means of which a further increase in the growth rate by increasing the supply of the III component and an improvement of the crystal quality by increasing the total pressure is possible without the occurrence of the harmful nucleations observed in case of the prior art.

The object is achieved by the invention specified in the claims, wherein each claim represents an independent solution of the object.

Through a multiplicity of experimentally as well as theoretically performed optimization trials, it was found that a modification of the gas inlet element solves the aforementioned object. In first instance, it is substantially provided that the gas inlet chambers are closed off toward the process chamber by annular walls. Unlike the prior art, all three gas inlet chambers disposed one above the other are closed off toward the process chamber by gas-permeable annular walls. However, the annular walls do not consist of a porous material but have gas outlet openings which are disposed close to one another. This is important because it was found that the porous walls have led to a homogenization of the gas introduction into the process chamber, but that the fine openings of the porous body become rapidly clogged. As causes for said clogging, high temperature and velocity gradients in the porous body are held responsible. Furthermore, it is important that the annular bodies disposed one above the other and forming the annular walls have a uniform outer diameter. Thus, the entire gas inlet element protruding from above into the process chamber has the outer shape of a circular cylinder. There are no parts protruding beyond the surface shell of said cylinder. Thus, the annular walls project, free of any jutting-out portions, into the process chamber. This serves for minimizing velocity gradients in the process gas flow exiting the gas inlet element. According to the invention, the edges of the gas outlet openings thus form the only stall edges of the outer wall. The edges extend only on straight or rounded portions. Thus, the contour line of the edges extends kink-free. The gas outlet openings form windows. They have a substantially constant opening area which remains constant over the entire thickness of the material of the annular body from the inner wall toward the outer wall. Said windows thus have reveals which extend in a straight line. The absolute dimension of the opening areas has an optimal range. It is optimal if the areas of the gas outlet openings are in the range between 2 $mm^2$ and 6 $mm^2$. It is further optimal if the gas outlet openings have an elongated shape. The gap width can be between 0.2 and 1.5 mm. The outlet openings of the annular walls which are adjacent to the ceiling or the bottom preferably have a greater slot width than those of the middle annular wall. While the slot width of the gas outlet openings of the middle annular wall is preferably approximately 0.3 mm, the slot width of the gas outlet openings of the outer annular walls is preferably approximately 1 mm. Also, the width/length ratio can be different for the different annular walls. The ratio of width to length depends substantially on the molar mass/min of the process gases to be introduced into the process chamber. If $AsH_3$ or $PH_3$ is used, the width/length ratio is approximately 0.3. When using $NH_3$, it is approximately 0.2. For the pure carrier gas—hydrogen or nitrogen—or organometallic components dissolved in the carrier gas, the ratio of slot width to slot length is in the range between 0.05 and 0.2. Preferably, it is approximately 0.05 for hydrogen and approximately 0.2 for nitrogen.

The gas outlet openings can in Principle have square or circular cross-sections. However, it was found that said cross-sections can be optimized. The ratio of length and width of the opening areas should lie in the range between 2 and 6 or in the range between 3 and 5 so that elongated opening cross-sections are generated. It is also of advantage if the opening area has a length/width ratio which is greater than 3. Theoretical considerations, model calculations and experiments have shown that under these conditions, the backflow from the process chamber into the gas inlet chamber is minimized. The gas outlet openings through which the flow passes in a straight line in the flow direction are preferably arranged uniformly distributed over the surface of the annular bodies.

It is preferred that the process gas flows in a straight line in the radial direction through the gas outlet openings so that the process gas is not subjected to a direction change. The gas outlet openings have a kink-free contour. Furthermore, the sum of the opening areas is of technological relevance. Said sum should be in the range between 15% and 50% of the total outer area of the annular walls. However, the porosity, thus the ratio between sum of the opening areas and total area, depends also on the process gases to be used. Through the topmost outlet openings and the lowermost outlet openings, hydrides are to be introduced into the process chamber. If $AsH_3$ or $PH_3$ are introduced therethrough, annular walls are used which have a porosity of approximately 25%. Said annular walls then extend on the top and bottom in each case over approximately 15% of the process chamber height. When using $NH_3$, the porosity of the upper or lower annular wall is preferably approximately 40%. The two annular walls then extend in each case over approximately 20% of the process chamber height. The middle zone extends over the remainder of the process chamber height, through which middle zone the organometallic compound and a carrier gas are introduced into the process chamber. If the carrier gas involves hydrogen, the porosity is preferably 15%. The middle annular zone then extends over approximately 70% of the reactor height. If nitrogen is used as carrier gas, the porosity is approximately 40%. The middle annular zone then extends over approximately 60% of the reactor height. Furthermore, it is of advantage if the elongated gas outlet openings overlap one another vertically. In this manner, a Bernoulli lock forms. The turbulence and associated velocity gradients in the vertical direction are therefore effectively avoided. Furthermore, it is of advantage if the elongated gas outlet openings extend inclined with respect to the vertical at an angle of 20° to 60°, preferably 30° to 45°. Preferably, the slots extend in the form of a herringbone pattern one above the other. Hereby, a so-called continuous vertical Bernoulli pump is avoided. The spacing between two adjacent gas outlet openings is selected in such a manner that the spacing is smaller than the length of the gas outlet openings. Preferably, said spacing lies between 0.5 mm and 2 mm. An optimal slot width is approximately 1 mm. The height distribution of the gas outlet zones, thus the annular areas, is preferably effected symmetrically in such a manner that the upper and the lower gas inlet zones have the same height. The material for the annular bodies can be quartz or graphite. As in the case of the prior art, the individual gas chambers are separated from one another by circular disk-shaped horizontal webs. The outer contour of such a circular disk-shaped horizontal web extends on a circular arc line. The annular bodies are preferably supported on the edge of the horizontal webs. In a preferred configuration, the gas inlet element is fixedly connected to the ceiling plate which forms the ceiling of the process chamber. Once the ceiling plate is opened, the gas inlet element is removed from the process chamber. The end of the gas inlet element that faces toward the susceptor is preferably located within a depression disposed in the center of the susceptor. The front end which is associated with the lowermost gas inlet chamber is preferably cooled. For this purpose, the plate-like horizontal web forming the front end has a coolant chamber through which a coolant can flow. The depth of the recess into which the front end of the gas inlet element enters is dimensioned in such a manner that the upper wall of the lowermost horizontal web is aligned with the upper side of the susceptor. The topmost gas inlet chamber also is delimited by a topmost plate-shaped body extending in the horizontal direction. The downwardly directed wall of the latter is aligned with the downwardly directed wall of the process chamber ceiling. While with the gas inlet element of the prior art, a total gas flow of maximum 50 slm at a total pressure of 200 mbar can be achieved, the modified gas inlet geometry allows for 100 slm total gas flow for a process chamber pressure of 400 mbar and more. The diameter of the gas inlet element is in the range between 40 and 100 mm. It was found that with a small diameter of the annular walls of 35 to 50 mm, preferably approximately 40 mm, a further increase of the total flow as well as the total pressure is possible. Moreover, if the gas inlet chambers are configured in such a manner that their vertical height increases disproportionately with the radial spacing from the center, total pressures of 800 mbar during an operation with more than 250 slm total gas flow are possible. Here, the process chamber can have a diameter of more than 600 mm. Thus, the process chamber of the device according to the invention has preferably a diameter between 500 mm and 700 mm. Here, the height of the process chamber is in the range from 25 to 30 mm.

BRIEF DESCRIPTION OF THE DRAWINGS

Exemplary embodiments of the invention are explained below with reference to accompanying drawings. In the figures.

DETAILED DESCRIPTION

Figure 1:
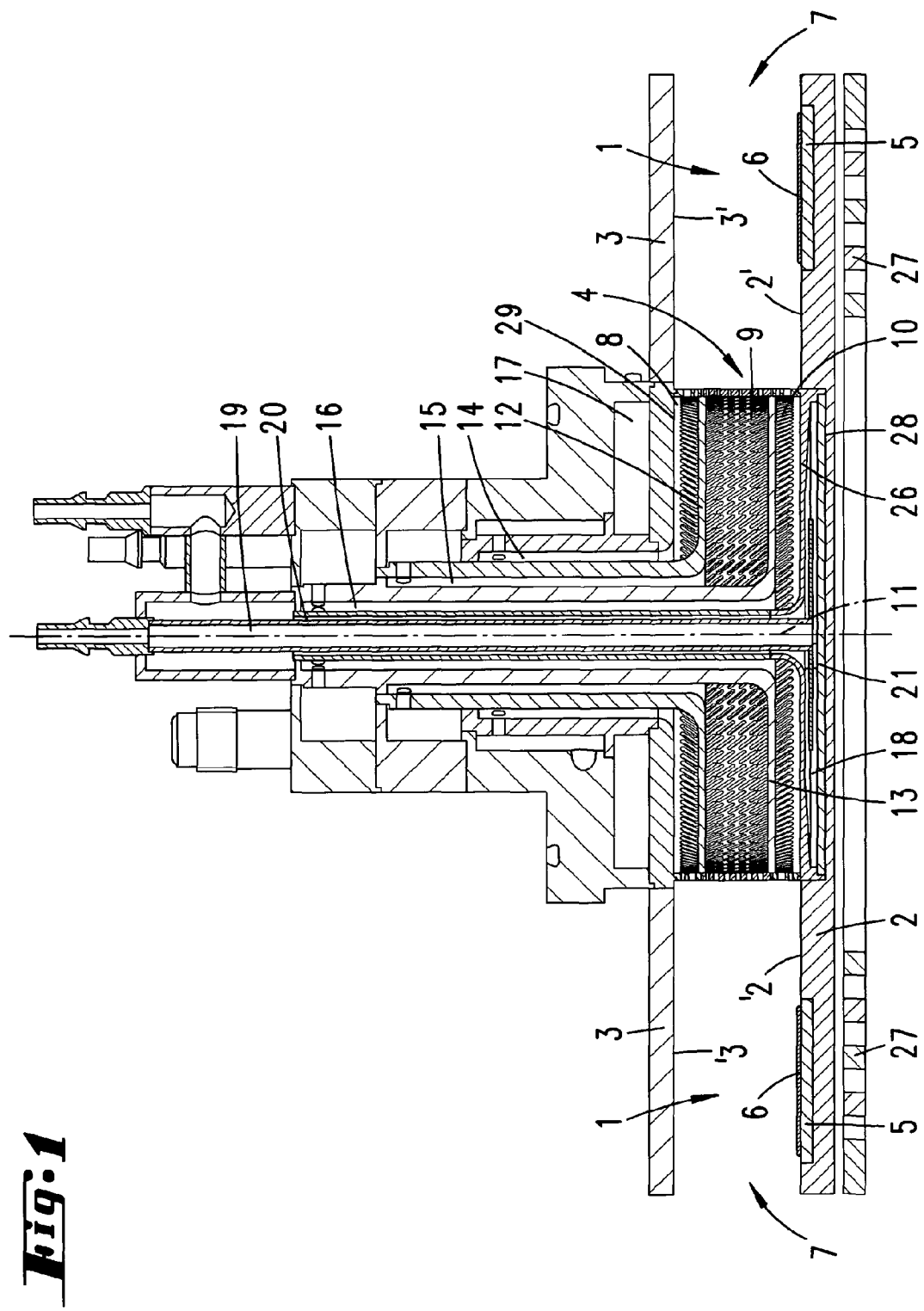
FIG. 1 shows a diagonal sectional view through a MOCVD reactor of a first exemplary embodiment of the invention, wherein for the purpose of clarity, details which are not necessary for the immediate explanation of the inventive concept are either omitted or illustrated roughly schematically.

In a non-illustrated outer housing which is vacuum-tight and connected to a vacuum pump, the actual process chamber 1 is located. For clarity reasons, the same is illustrated in FIG. 1 with a reduced diameter so as to be able to illustrate the constructional details of the gas inlet element 4 more clearly.

Figure 3:
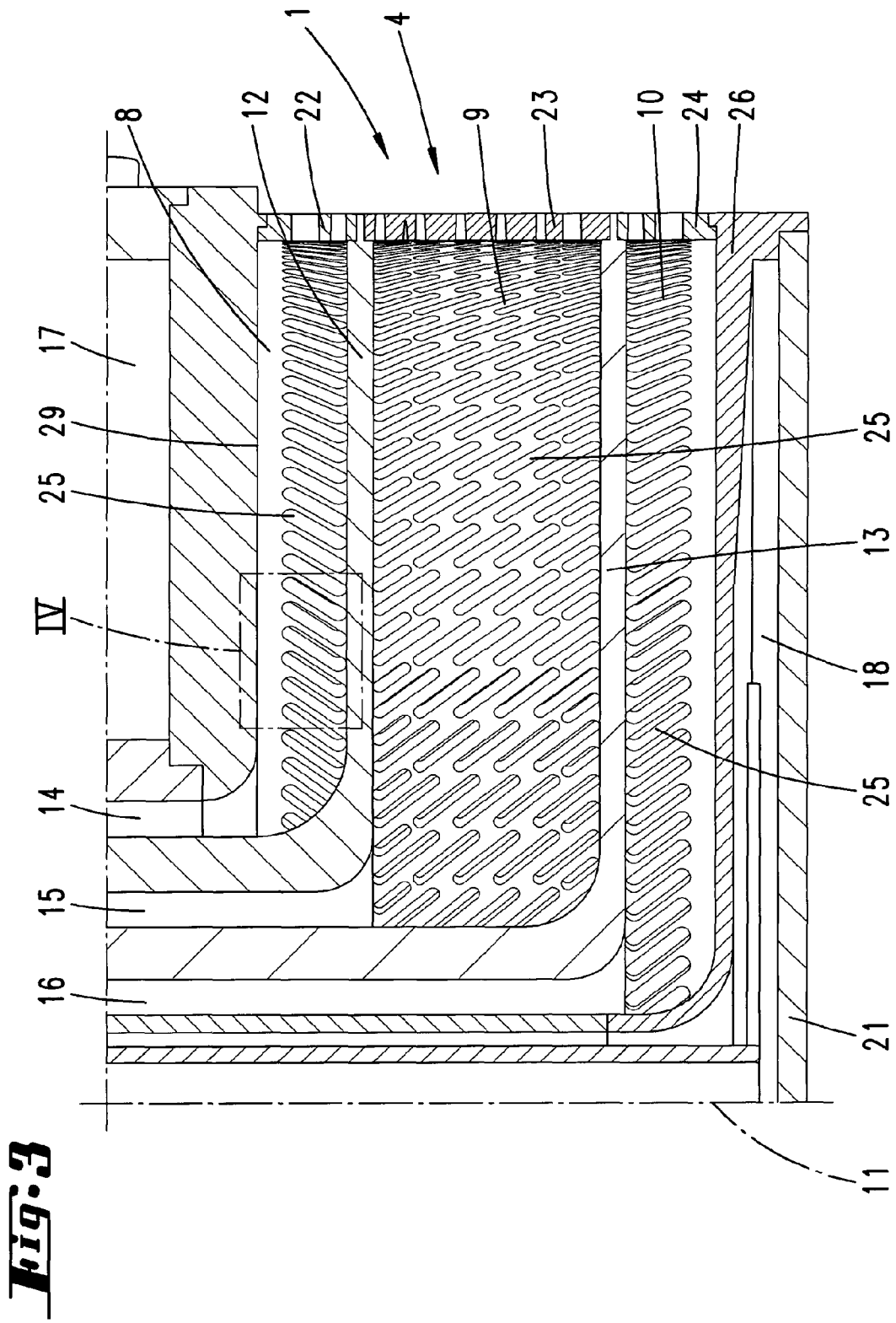
FIG. 3 shows a further enlarged detail of the gas inlet element according to FIG. 1 in the region of the gas inlet chambers.

The bottom 2' of the process chamber 1 is formed from a susceptor 2 made of quartz or graphite. This involves a plate-shaped body having a diameter between 500 mm and 700 mm. In the center of said circular disk-shaped plate, there is a cut-out 28 which in case of the first exemplary embodiment has an inner diameter of approximately 60 to 100 mm. Around said central cut-out, a plurality of substrate holders 5 is annularly arranged around the center 11, which substrate holders each lie in cut-outs, are configured in a circular disk-shaped manner, and are rotationally driven by a gas flow. With respect to the arrangement, reference is made to FIG. 3 of DE 10 2004 009 130 A1.

Above the susceptor 2, a process chamber ceiling 3 extends which consists of graphite or quartz and which, with its lower side facing toward the susceptor 2, forms the ceiling wall 3' of the process chamber. The outer diameter of the process chamber ceiling 3 corresponds substantially to the outer diameter of the susceptor 2. The spacing of plates 2, 3 that run parallel to one another, which defines the process chamber height, is approximately 30 mm.

In the center of the process chamber ceiling 3, there is an opening through which the gas inlet element 4 projects into the process chamber 1. The process chamber ceiling 3 can be carried by the gas inlet element 4. The cylindrical portion of the gas inlet element 4 projects into the process chamber 1 and has a diameter which corresponds to the diameter of the cut-out 28. The front end 21 of the gas inlet element 4 lies within the cut-out 28, namely facing the bottom of the same. The zone of the process chamber 1 that directly adjoins the outer wall of the cylindrical gas inlet element 4 in the radial direction forms a gas inlet zone in which process gases from the gas-permeable cylinder casing wall of the gas inlet element 4 are introduced into the process chamber. Here, the process gases flow in the radial direction through the process chamber 1, compounds of the group III and group V or, respectively, group II and group VI transported by a carrier gas decomposing pyrolitically. The decomposition products are deposited on substrates resting on the substrate holders 5. The residual gas exits the process chamber 1 in the radial direction through the gas outlet region designated by the reference number 7.

The cylindrical portion of the gas inlet element 4 that projects into the process chamber 4 has three gas inlet chambers 8, 9, 10 disposed vertically one above the other. The three gas inlet chambers 8, 9, 10 disposed one above the other are separated from one another by plate-shaped horizontal webs 12, 13 extending in the horizontal plane. The front end 21 of the gas inlet element 4, which has a coolant chamber 18 through which a coolant can flow, forms a lowermost horizontal web. The upper wall 29 of the topmost gas inlet chamber 8 is likewise formed by a horizontal web. The latter extends in the radial direction toward the process chamber ceiling 3.

The topmost gas inlet chamber 8 is connected by means of a feed line 14 to a carrier gas source and a hydride source. The carrier gas can involve hydrogen, nitrogen or a noble gas. The hydride can involve $AsH_3$, $PH_3$ or preferably $NH_3$. Said gas mixture flows through the feed line 14 into the gas inlet chamber 8. Toward the process chamber 1, the gas inlet chamber 8 is enclosed by an annular wall. The annular body 22 forming said wall can consist of quartz or graphite and is supported on the outer edge of the horizontal web 12. The annular body 22 has closely adjacent outlet openings 25 which have the shape of longitudinal slots and extend obliquely. The outlet openings 25 running parallel to one another form a web-interrupted annular opening.

Below the topmost gas inlet chamber 8, a gas inlet chamber 9 is located which is approximately twice as high and is connected to a feed line 15. The feed line 15 is connected to a carrier gas source and a source of an organometallic starting material. The organometallic starting material can involve TMGa, TMIn or TMAl. The latter is transported together with the carrier gas through the feed line 15 into the gas inlet chamber 9. This gas inlet chamber 9 also is enclosed by an annular body 23, the wall of which has oblique longitudinal slots as outlet openings. Here, a plurality of rows of web-interrupted outlet openings 25 are located one above the other, the individual outlet openings overlapping one another not only vertically but also in the horizontal direction. The size of said outlet openings 25 corresponds to the size of the outlet openings 25 of the upper annular body 22. However, the inclination angle of the outlet openings of the middle annular body 23 is inclined in the opposite direction relative to the outlet openings 25 of the upper annular body and those of a lower annular body 24.

By means of a further horizontal web 13, the middle gas inlet chamber 9 is separated from a lower gas inlet chamber. The lower gas inlet chamber 10 is connected to a feed line 16. The feed line 16 in turn is connected to a carrier gas source and a hydride source. The carrier gas and the hydride transported therewith are transported through the feed line 16 into the gas inlet chamber 10 and enter through gas outlet openings 25, which are configured to be identical to those of the topmost annular body 22, from the lowermost annular body 24 into the process chamber. The wall of the horizontal web 26 that faces toward the gas inlet chamber 10 is substantially aligned here with the surface 2' of the susceptor 2.

Figure 4:
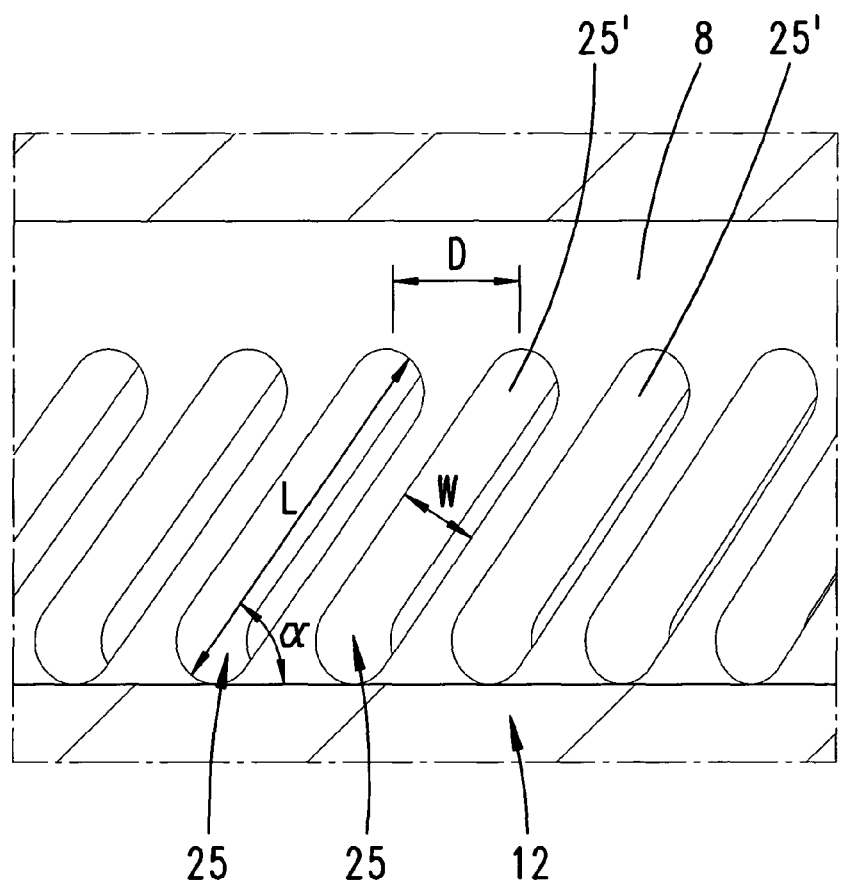
FIG. 4 shows the enlarged region IV in FIG. 3

Using the upper annular body 22 as an example, FIG. 4 shows the configuration and arrangement of outlet openings 25 which are also provided in this manner in the middle annular body 23 and in the lower annular body 24. The outlet openings 25 have the shape of elongated holes having edge portions which run straight and parallel to one another and extend along the longitudinal direction L. The length L of the outlet openings is in the range from 2 mm to 20 mm. The width W of the outlet openings 25 is in the range from 0.2 mm to 1.5 mm. It was found to be advantageous if the ratio of L/W is greater than 3 or is in the range of 3 to 5. The vertex spacing D between two adjacent outlet openings 25 is selected such that the web separating the two longitudinal sides of two adjacent outlet openings 25 has a width which is of the order of the width W or corresponds approximately to the dimension of the width W. The narrow sides of the outlet openings 25 extend on a rounded contour line and in particular on a circular arc line. The outlet openings 25 extend in the radial direction in a straight line. The area contour described above consists of two semicircles positioned opposite one another and two straight connections of the two semicircles, said connections being positioned opposite one another. The diameter of the semicircles corresponds here to the width W of the outlet opening 25. Each outlet opening 25 extends with constant cross-sectional area and constant peripheral contour through the entire thickness of the material of each annular body 22, 23, 24. The openings 25 can be generated, for example, by laser cutting. Consequently, the walls 25' of the outlet openings 25 extend in a straight line.

Overall, the multiplicity of outlet openings 25 is uniformly distributed over the entire circumferential surface of the cylindrical portion of the gas inlet element 4. All annular bodies 22, 23, 24 disposed one above the other have the same inner and outer diameters. The entire opening area formed by the outlet openings 25 corresponds to approximately 20% to 50% of the entire outer surface shell area of the cylindrical portion, thus the surface shell area of the annular bodies 22, 23, 24.

To ensure that within the gas inlet chambers 8, 9, 10, no undesired pre-decomposition of the starting materials, thus $AsH_3$, $PH_3$, $NH_3$, TMGa, TMIn and TMAl, takes place, the portion of the gas inlet element 4 that projects into the process chamber 1 is cooled not only in the region of the front end 21, namely by means of liquid coolant flowing through the cooling channels 19, 20 into the cooling chamber 18, but also by means of a coolant chamber 17 which is disposed above the topmost gas inlet chamber 8. A coolant also flows through this chamber.

The heating of the process chamber 1 takes place from below by means of a heater which is designated by the reference number 27 and is illustrated only schematically. The latter can have a multiplicity of spirally arranged windings which are formed by an IR heater or a resistance heater. The susceptor 2 is heated via radiation or eddy currents. The process gas within the process chamber 1 is also heated. Due to heat conduction or heat radiation, the process chamber ceiling 3 heats up as well.

The feed lines 14, 15 and 16 run transversely to the direction of extent of the process chamber 1, thus in the vertical direction and coaxially with one another. They are connected via non-illustrated lines to the above-described gas sources of a gas supply system. There, the flow rates can be adjusted.

For depositing a GaN buffer layer on an $Al_2O_3$ substrate, the susceptor 2 is heated in such a manner that the surface of the substrate 6 reaches a temperature which is approximately 1200° C. At a total pressure of 400 mbar, in total more than 100 slm of process gas flows from the gas inlet element 4 into the process chamber 1. The operation takes place with TMGa flow rates of more than 2.5 mmol/min and up to 3.5 mmol/min. Under these process conditions, GaN is deposited onto the substrate or onto a nucleation layer previously deposited on the substrate. By using $NH_3$ as V component, growth rates of 6 μm per hour and more are achieved here.

The gas outlet area of the annular bodies 22, 23, 24 is optimized according to the previously described measures in such a manner that only minimal temperature and velocity gradients occur there. The stall edges at which turbulences or other effects influencing the homogeneity of the gas flow can develop are minimized. The substantially ovally-extending edges of the outlet openings 25 form the only stall edges. Although not only directly adjacent to the annular bodies 22, 23, 24, but also below the process chamber ceiling 3, temperature conditions prevail which in principle allow a nucleation, the latter is effectively prevented by the geometry and arrangement of the outlet openings 25.

Figure 5:
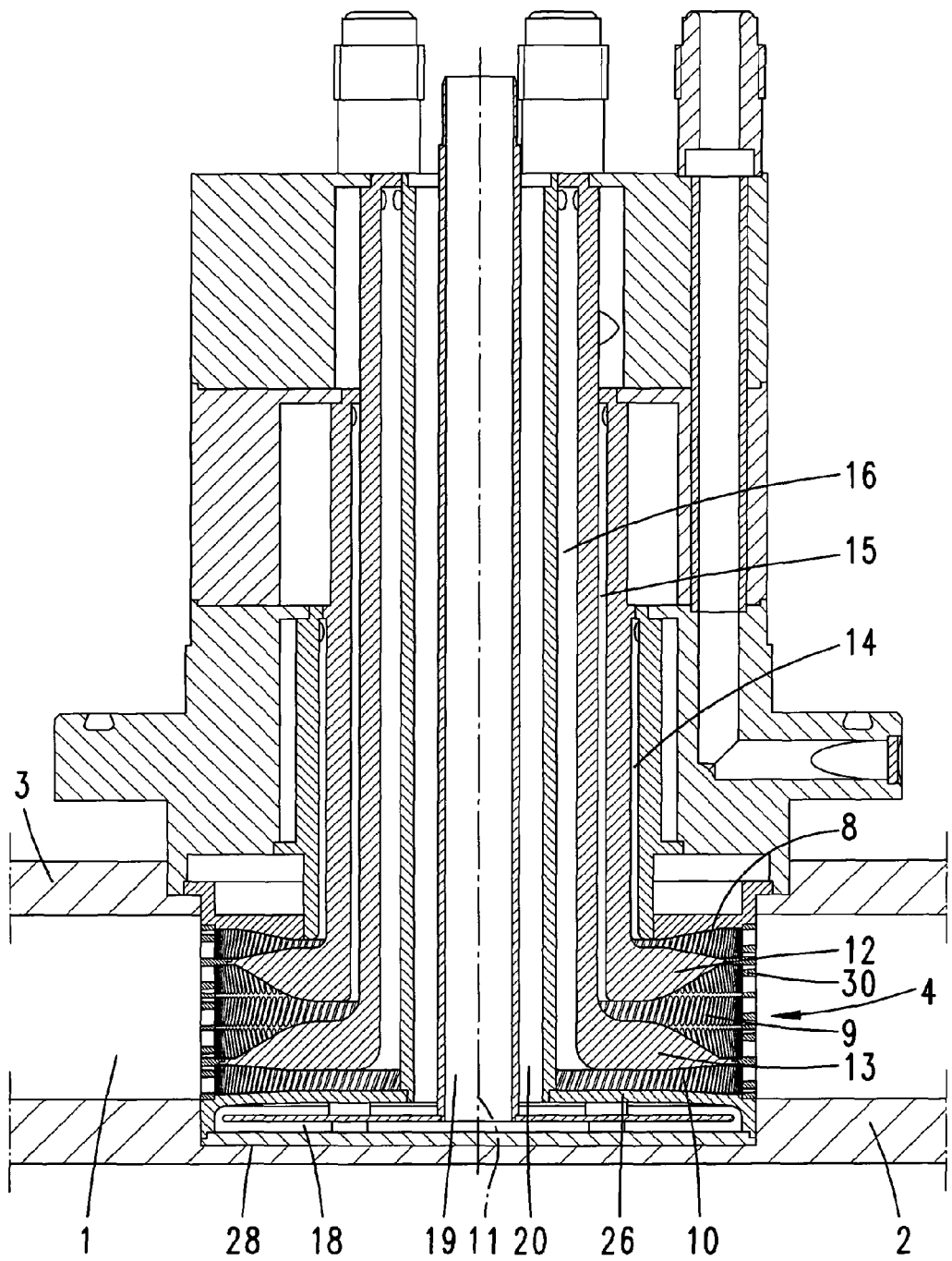
FIG. 5 shows a gas inlet element of a second exemplary embodiment in an illustration corresponding to FIG. 1.

FIG. 5 shows a further improvement of the geometry of the gas inlet element 4 by means of which improvement, the region in which the growth rate depends linearly on the TMGa flow is further enlarged and therefore the efficiency of the reactor is increased.

Figure 2:
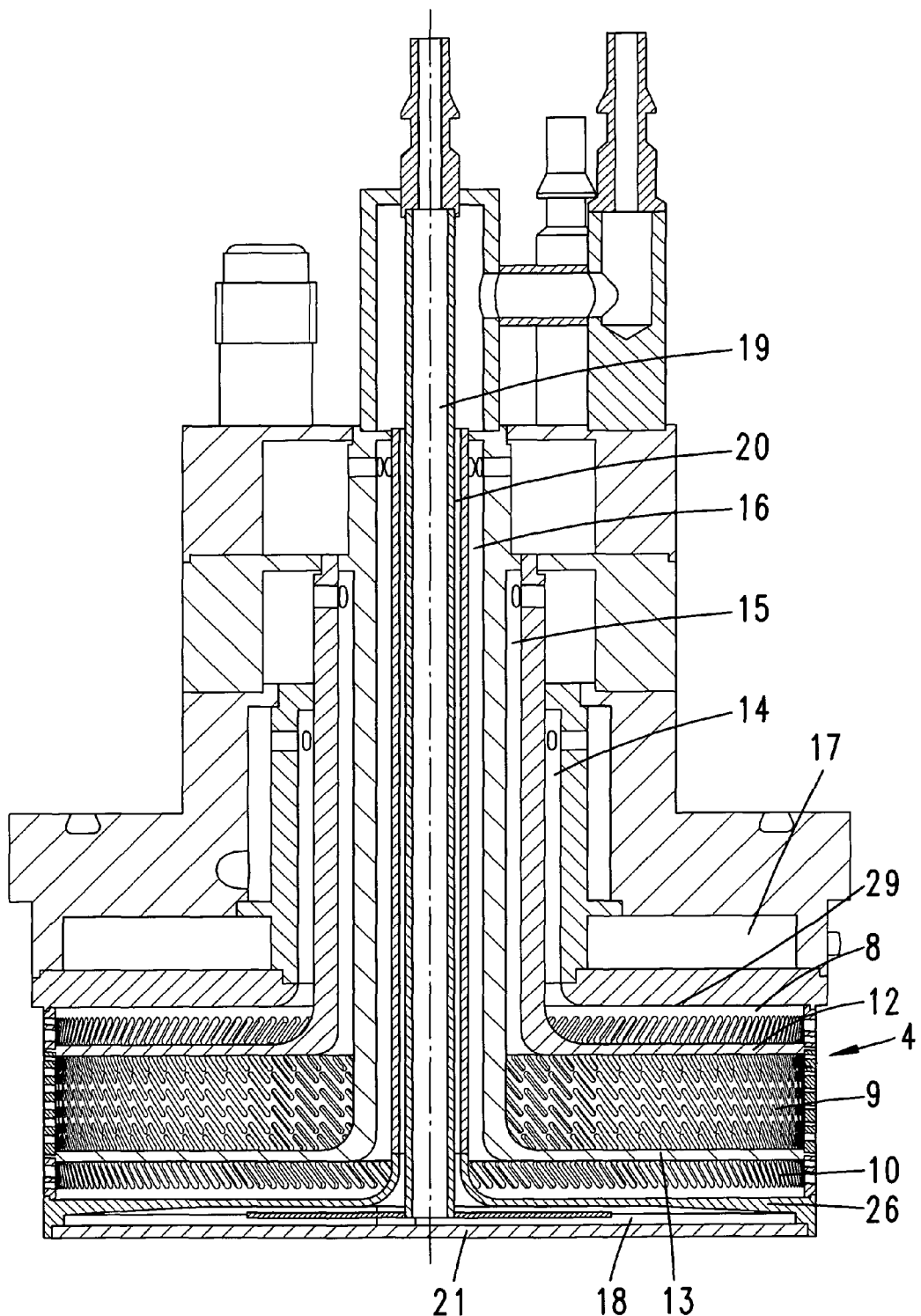
FIG. 2 shows an enlarged illustration of the gas inlet element of the device according to FIG. 1.

The cylindrical portion of the gas inlet element 4 illustrated in FIG. 5 has a reduced diameter, namely approximately 40 mm. Here, unlike the gas inlet element 4 illustrated in the FIGS. 1 to 3, the horizontal walls of the gas inlet chambers 8, 9, 10 are curved. The height of the gas inlet chambers 8, 9, 10 increases constantly in the radial direction from the center 11 to the annular bodies 22, 23, 24. The increase is disproportional so that the gas velocity in the radial direction within the gas inlet chambers 8, 9, 10 is substantially constant.

The design of the slots forming the outlet openings 25, the arrangement of the slots on the wall of the gas inlet chambers 8, 9, 10, and their spacing, depends on the process gas to be introduced through the respective gas inlet zone into the process chamber. The slots are preferably inclined at an angle of 30° to 45° with respect to the vertical. In this manner, a porosity, thus a ratio of the sum of all openings to the total area, of 15% to 50% can be prepared. The porosity is configured in connection with the vertical height of the gas inlet zones according to the molar mass/min of the process gases. When using $AsH_3$ or $PH_3$ as hydride, the porosity of the upper and lower wall of the gas inlet chambers 8, 10 is approximately 25%. In this case, the height of the gas inlet chamber 8, 10 is approximately 15% of the process chamber height. When using $NH_3$, the porosities of the walls of the gas inlet chambers 8, 10 are approximately 40%. The respective gas inlet chamber then extends over 20% of the vertical height of the process chamber. The middle inlet zone 9 for the organometallic compound has a porosity of 15% and extends over 70% of the total outlet area if hydrogen is used as carrier gas. If oxygen is used as carrier gas, the porosity of the wall of the middle gas inlet zone 9 is to be approximately 40%. The entire annular area of the middle gas inlet chamber 8 then extends over 60% of the total outlet area.

With regard to the gas inlet chambers 8, 9, 10 disposed one above the other, the slots are to be arranged in herringbone pattern one above the other. Thus, they are to be alternatingly inclined in, the respective other direction.

The width/length ratio of the slots depends also on the molar masses/min. When using $AsH_3$ or $PH_3$, the width/length ratio is approximately 0.3, when using $NH_3$ approximately 0.2, when using hydrogen approximately 0.05, and when using nitrogen approximately 0.2. The spacing between the individual slots is typically approximately 1 mm. The height distribution of the inlet zones is effected symmetrically.

In the exemplary embodiments, the gas inlet chambers 8, 9, 10 are open cavities. In these cavities, in particular due to a curved course of walls of the gas inlet chambers, a mainly parabolic flow profile can develop. In the non-illustrated exemplary embodiment, flow barriers can be located in the gas inlet chambers 8, 9, 10 upstream of the annular walls 22, 23, 24. Such flow barriers can be formed from porous bodies, meshes or the like. These additional barriers equalize the flow profile and prevent the formation of jets.

All features disclosed are (in themselves) pertinent to the invention. The disclosure content of the associated/accompanying priority documents (copy of the prior application) is also hereby included in full in the disclosure of the application, including for the purpose of incorporating features of these documents in claims of the present application.

What is claimed is:

1. A device for depositing layers, the device comprising a process chamber (1) arranged substantially rotationally symmetrically about a center (11), the process chamber having
   a bottom formed by a susceptor (2) disposed in a horizontal plane,
   a process chamber ceiling (3) disposed vertically above the susceptor (2),
   a gas inlet element (4) which extends in the center (11) between the susceptor (2) and the process chamber ceiling (3) and has gas inlet chambers (8, 9, 10) which are disposed vertically one above the other, and
   a heater (27) disposed vertically below the susceptor (2), for heating the susceptor (2),
   wherein, on the susceptor (2), a multiplicity of substrate holders (5) arranged spaced apart from the gas inlet element (4) are provided for accommodating substrates (6) to be coated,
   wherein a topmost gas inlet chamber (8) of the gas inlet chambers is directly adjacent to the process chamber ceiling (3) and is connected to a feed line (14) for introducing a hydride together with a carrier gas into the process chamber (1),
   wherein a lowermost gas inlet chamber (10) of the gas inlet chambers is directly adjacent to the susceptor (2) and is connected to a feed line (16) for introducing a hydride together with a carrier gas into the process chamber,
   wherein at least one middle gas inlet chamber (9) disposed between the lowermost (10) and the topmost (8) gas inlet chambers is connected to a feed line (15) for introducing an organometallic compound into the process chamber (1),
   characterized in that the gas inlet chambers (8, 9, 10) are closed off toward the process chamber (1) by annular walls (22, 23, 24),
   the annular walls (22, 23, 24) having a multiplicity of closely adjacent gas outlet openings (25), a uniform outer diameter, and an outer wall which is substantially without projections and faces toward the process chamber (1).

2. The device according to claim 1, further characterized in that for minimizing velocity gradients in the process gas flow exiting from the gas inlet element (4), the edges of the gas outlet openings (25) are the only stall edges of the outer wall and run kink-free along a contour line which has only straight or rounded portions.

3. The device according to claim 2, further characterized in that the gas outlet openings (25) extend substantially in a straight line with a constant opening area from the inner wall facing toward the gas inlet chamber (8, 9, 10) to the outer wall of the associated annular wall (22, 23, 24).

4. The device according to claim 3, further characterized in that opening areas of the gas outlet openings are in the range between 2 mm$^2$ and 5 mm$^2$.

5. The device according to claim 1, further characterized in that the ratio of length (l) and width (w) of opening areas of the gas outlet openings lies in the range between 2 and 6, preferably between 3 and 5, and particularly preferably, is approximately 4 or higher.

6. The device according to claim 1, further characterized in that a sum of opening areas of the gas outlet openings (25) amounts to between 15% and 50% of a total outer area of the annular walls (22, 23, 24).

7. The device according to claim 1, further characterized in that the gas outlet openings (25) extend inclined at an angle between 30 and 60 degrees with respect to a vertical.

8. The device according to claim 1, further characterized in that the gas outlet openings (25) of an annular wall (23) are arranged in a plurality of rows one above the other, the gas outlet openings (25) of different rows overlapping one another in the vertical direction.

9. The device according to claim 1, further characterized in that a spacing (d) between two adjacent gas outlet openings (25) is such that the two adjacent gas outlet openings (25) overlap one another in a vertical direction and the spacing is approximately 1 mm.

10. The device according to claim 1, further characterized in that the annular walls are formed by annular bodies (22, 23, 24) consisting of quartz or graphite.

11. The device according to claim 1, further characterized in that the annular bodies (22, 23, 24) rest on edges of circular disk-shaped horizontal webs (12, 13, 26).

12. The device according to claim 11, further characterized in that a front end (21) of the gas inlet element (4), which front end has in particular a coolant chamber (18), lies in a central cut-out of the susceptor (2) in such a manner that the horizontal web (26) delimiting the lowermost gas inlet chamber (10) toward the front end (21) is approximately aligned with a surface (2') of the susceptor (2) that faces toward the process chamber (1).

13. The device according to claim 12, further characterized in that the upper wall (29) of the topmost gas inlet chamber (8) is substantially aligned with a lower side (3') of the process chamber ceiling (3) that faces toward the process chamber (1).

14. The device according to claim 11, further characterized by a smooth-walled curved course of the surfaces of the horizontal webs (12, 13, 26) that face toward the gas inlet chambers (8, 9, 10).

15. The device according to claim 1, further characterized in that a diameter of the process chamber is in a range between 500 to 700 mm, and a uniform outer diameter of the annular walls (22, 23, 24) is approximately 35 to 50 mm.

16. The device according to claim 1, further characterized in that a diameter of the process chamber (1) is in a range from 500 to 700 mm, and a height of the process chamber (1) is approximately 25 to 30 mm.

17. The device according to claim 1, further characterized in that the height of the gas inlet chambers (8, 9, 10) increases in a flow direction of the gas.

18. A method for operating a device, the device comprising a process chamber (1) arranged substantially rotationally symmetrically about a center (11), the process chamber having
- a bottom formed by a susceptor (2) disposed in a horizontal plane,
- process chamber ceiling (3) disposed vertically above the susceptor (2),
- a gas inlet element (4) which extends in the center (11) between the susceptor (2) and the process chamber ceiling (3) and has gas inlet chambers (8, 9, 10) which are disposed vertically one above the other, and
- a heater (27) disposed vertically below the susceptor (2), for heating the susceptor (2),
- wherein, on the susceptor (2), a multiplicity of substrate holders (5) arranged spaced apart from the gas inlet element 4 are provided for accommodating substrates (6) to be coated,
- wherein a topmost as inlet chamber 8 of the gas inlet chambers is directly adjacent to the process chamber ceiling (3) and is connected to a feed line (14) for introducing a hydride together with a carrier gas into the process chamber (1),
- wherein a lowermost gas inlet chamber (10) of the gas inlet chambers is directly adjacent to the susceptor (2) and is connected to a feed line (16) for introducing a hydride together with a carrier gas into the process chamber,
- wherein at least one middle gas inlet chamber (9) disposed between the lowermost (10) and the topmost (8) gas inlet chambers is connected to a feed line (15) for introducing an organometallic compound into the process chamber (1),
- characterized in that the gas inlet chambers (8, 9, 10) are closed off toward the process chamber (1) by annular walls (22, 23, 24),
- the annular walls (22, 23, 24) having a multiplicity of closely adjacent gas outlet openings 25, a uniform outer diameter, and an outer wall which is substantially without projections and faces toward the process chamber (1), the method, comprising:
- within the process chamber, introducing through the gas outlet openings (25) of the topmost gas inlet chamber (8) and through the gas outlet openings (25) of the lowermost gas inlet chamber (10), together with the carrier gas, the hydride, and through the gas outlet openings (25) of the at least one middle gas inlet chamber (9), the organometallic compound, the process chamber heated by the heater (27), the introduction of the hydride and the organometallic compound characterized (i) in that a total gas flow of gases introduced through the gas outlet openings (25) into the process chamber is greater than 100 slm and (ii) in that a total pressure in the process chamber is greater than 400 mbar.

19. The method of claim 18, further characterized in that the hydride is $NH_3$, the organometallic compound is TMGa, and the heater (27) is operated in such a manner that a surface temperature of the susceptor (2) within the process chamber is in a range between 500° C. and 1200° C.

* * * * *